United States Patent [19]
Rangasayee et al.

[11] Patent Number: 6,060,903
[45] Date of Patent: May 9, 2000

[54] PROGRAMMABLE LOGIC DEVICE ARCHITECTURE INCORPORATING A DEDICATED CROSS-BAR SWITCH

[75] Inventors: Krishna Rangasayee, Sunnyvale; Robert N. Bielby, Pleasanton, both of Calif.

[73] Assignee: Altera Corporation, San Jose, Calif.

[21] Appl. No.: 08/951,090

[22] Filed: Oct. 15, 1997

Related U.S. Application Data

[60] Provisional application No. 60/044,019, May 6, 1997.

[51] Int. Cl.[7] .................................................. G06F 7/38
[52] U.S. Cl. .............................. 326/39; 326/40; 326/41
[58] Field of Search ............................ 326/10, 38, 39, 326/40, 41

[56] References Cited

U.S. PATENT DOCUMENTS

| | | |
|---|---|---|
| Re. 34,363 | 8/1993 | Freeman . |
| 5,455,525 | 10/1995 | Ho et al .................................... 326/41 |
| 5,498,975 | 3/1996 | Cliff et al. .............................. 326/10 |
| 5,550,782 | 8/1996 | Cliff et al. . |

*Primary Examiner*—Michael Tokar
*Assistant Examiner*—A. Tran
*Attorney, Agent, or Firm*—Beyer & Weaver, LLP

[57] ABSTRACT

A programmable logic device architecture incorporating a cross-bar switch is disclosed. In a preferred embodiment, a plurality of logic cells is programmably interconnected to form an array of logic cells capable of implementing complex logic functions. A user selectable cross-bar switch block having dedicated programmable connectors is coupled to the array of logic cells by way of a mode control circuit switch. The mode control circuit switch is arranged to couple the dedicated cross-bar switch block to the array of logic cells in a first mode and to de-couple the cross-bar switch block from the array of logic blocks in a second mode.

21 Claims, 9 Drawing Sheets

PROGRAMMABLE LOGIC DEVICE ARCHITECTURE INCORPORATING A DEDICATED CROSS-BAR SWITCH

This application claims benefit of priority under 35 U.S.C. 119(e) of provisional application "Cross Bar Switching in PLDs" Ser. No. 60/044019 filed May 6, 1997.

BACKGROUND OF THE INVENTION

1. Field of the Invention

The present invention relates generally to the field of programmable logic devices. More specifically the present invention provides an improved programmable logic architecture by incorporating a reconfigurable dedicated cross-bar switch block capable of independent implementation of complex signal routing and signal processing functions.

2. 2. Description of the Related Art

A programmable logic device or PLD is a programmable integrated circuit that allows the user of the circuit, using software control, to customize the logic functions the circuit will perform. The logic functions previously performed by small, medium, and large-scale integration integrated circuits can instead be performed by programmable logic devices. When an integrated circuit manufacturer supplies a typical programmable logic device, it is not yet capable of performing any specific function. The user, in conjunction with software supplied by the manufacturer or created by the user or an affiliated source, can program the PLD to perform the specific function or functions required by the user's application. The PLD then can function in a larger system designed by the user just as though dedicated logic chips were employed. For the purpose of this description, it is to be understood that a programmable logic device refers to once programmable as well as reprogrammable devices.

Programmable logic encompasses all digital logic circuits configured by the end user, including field programmable gate arrays (FPGAs) and complex programmable logic devices (CPLDs). FIG. 1A is an illustration of a CPLD known as embedded array programmable logic. The general architecture of the embedded array programmable logic device will be generally familiar to those knowledgeable of the FLEX10K™ logic family of devices manufactured by the Altera Corporation of San Jose, Calif. Such an architecture is described in U.S. Pat. No. 5,550,782 and Altera Data Book 1996, which are incorporated herein by reference. Although only a few logic array blocks or memory blocks are illustrated, it should be appreciated that any number may be provided in order to meet the needs of a particular system.

Using the described embedded array type architecture, logic functions may be formed from each logic array block, or LAB, and various memory/logic functions may be formed from each embedded array block, or EAB. Each EAB and LAB may be programmably coupled to a plurality of vertical and horizontal conductors by appropriately situated associated programmable connectors such that an array capable of performing complex logic as well as complex logic/memory operations is formed. Each EAB includes an array of memory cells capable of operation as either a random access memory, static random access memory, dynamic access memory, or other configurations suitable for a desired application.

As an example, LAB 102 may be electrically coupled to a horizontal conductors 174 and 176 by programmable connectors 180 and 182, respectively and vertical conductors 190 and 194 by programmable connectors 184 and 186, respectively. In a similar fashion each of the array of EABs may be electrically coupled to at least one of each of the plurality of vertical and horizontal conductors. By way of example, EAB 104 may be electrically coupled to vertical conductors 192 and 191 by way of programmable connectors 195 and 197, respectively, and horizontal conductors 174 and 176 by way of programmable connectors 193 and 199, respectively. In this way, an embedded array programmable logic device capable of implementing complex logic and combined logic/memory functions is formed.

Cross-bar switches are commonly used in networking applications, such as switched LAN and ATM. Cross-bar switching schemes are also commonly used in telecommunications, networking, digital signal processing and multiprocessing systems. The basic building block in these switching schemes is an N input–N output (N×N) cross-bar switch 150 as illustrated in FIG. 1B. The N×N cross-bar switch 150 is capable of passing data between any one of a first plurality of the N bi-directional ports 152 to any one of a second plurality of N bi-directional ports 154.

Cross-bar switches perform many different tasks in addition to signal routing. For example, in some switching architectures, the destination address is embedded in the packetized data that is being rerouted. These switches perform address stripping and translation, assign routing channels, and may even provide some buffering for data packets.

Because cross-bar switches contain functionality in addition to pure signal routing, they are usually implemented as ASICs (Application Specific Integrated Circuits). An ATM (Asynchronous Transfer Mode) switch used extensively in networks such as LANs, WANs, and the Internet is but one example of a cross bar switch containing functionality. In the case of the ATM switch cited, such functionality may include Quality of Service (QoS) and traffic control functions in addition to the more conventional signal routing associated with a cross bar switch.

Unfortunately, cross-bar switches implemented as ASICs have several disadvantages. One such disadvantage is the time-to-market risks associated with the relatively long cycle time necessary for the implementation of a new ASIC design. An additional disadvantage with the use of ASICs for cross bar switches is the fact that ASIC based cross-bar switches cannot be used for reconfigurable applications since ASICs are "hardwired" and must be redesigned for any new application.

In view of the foregoing, it is advantageous and therefore desirable to have available a programmable logic device which is capable of being user selected to perform complex logic functions in concert with or independent of cross-bar switch based signal routing and processing functions.

SUMMARY OF THE INVENTION

To achieve the foregoing and other objects and in accordance with the purpose of the present invention, a programmable logic device architecture incorporating a cross-bar switch is disclosed. In a preferred embodiment, a plurality of logic cells is programmably interconnected to form an array of logic cells suitable for use in implementing complex logic functions. A dedicated cross-bar switch block having a first and a second plurality of bi-directional ports is selectably coupled to the array of logic cells by way of an isolation circuit. The isolation circuit acts to couple the cross-bar switch block to the array of logic cells in a first mode and to de-couple the cross-bar switch block from the array of logic blocks in a second mode. Complex signal routing and signal processing functions may be implemented by appropriately configuring the cross-bar switch block.

In another aspect of the invention, a method of implementing a desired function using a programmable logic device having a dedicated cross-bar switch block that may be selectively coupled to an array of logic cells capable of performing complex logic functions is disclosed. The method includes the following operative steps. A first mode signal is supplied to an isolation circuit associated with the dedicated cross-bar switch block, the isolation circuit then acts to couple the cross-bar switch block to a plurality of conductors that interconnect the array of logic cells. The cross-bar switch block is then configured to perform desired signal routing or signal processing functions by coupling selected ones of the first plurality of bidirectional ports to selected ones of the second plurality of bidirectional ports.

If another signal routing or signal processing function is desired, the cross-bar switch block may be appropriately reconfigured to perform the desired function, otherwise, the cross-bar switch block may be de-coupled from the plurality of conductors by supplying a second mode signal to the isolation circuit.

In yet another aspect of the invention, a programmable logic device architecture incorporating a dedicated programmable cross-bar switch is disclosed. The programmable logic device including a plurality of logic blocks suitable for use in implementing desired logic functions is interconnected by way of associated programmable block connectors to form an array of logic blocks. Each of the array of logic blocks includes an associated array of internal logic cells that are interconnected by way of associated programmable cell connectors. The programmable logic device also includes a dedicated programmable cross-bar switch block that is separate and distinct from the logic blocks and does not include programmable logic cells suitable for implementing desired logic functions. The dedicated programmable cross-bar switch block is suitable for passing data between associated programmable block connectors.

DESCRIPRIONS OF THE PREFERRED EMBODIMENTS

In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1A:
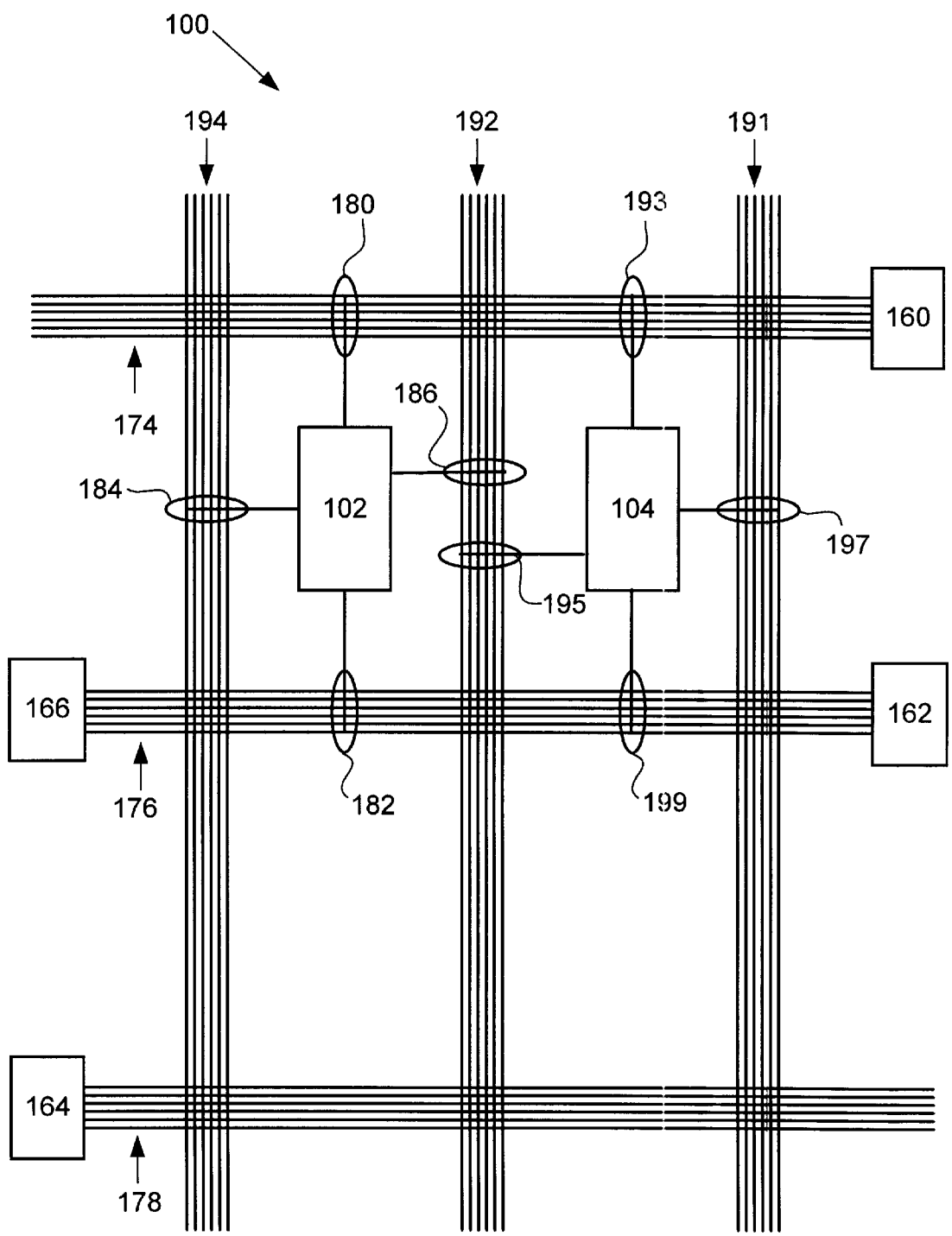
FIG. 1A is a block diagram of embedded array type programmable logic device architecture illustrating an embedded array block and a logic array block coupled to horizontal and vertical conductors by way of associated programmable connectors.
Figure 1B:
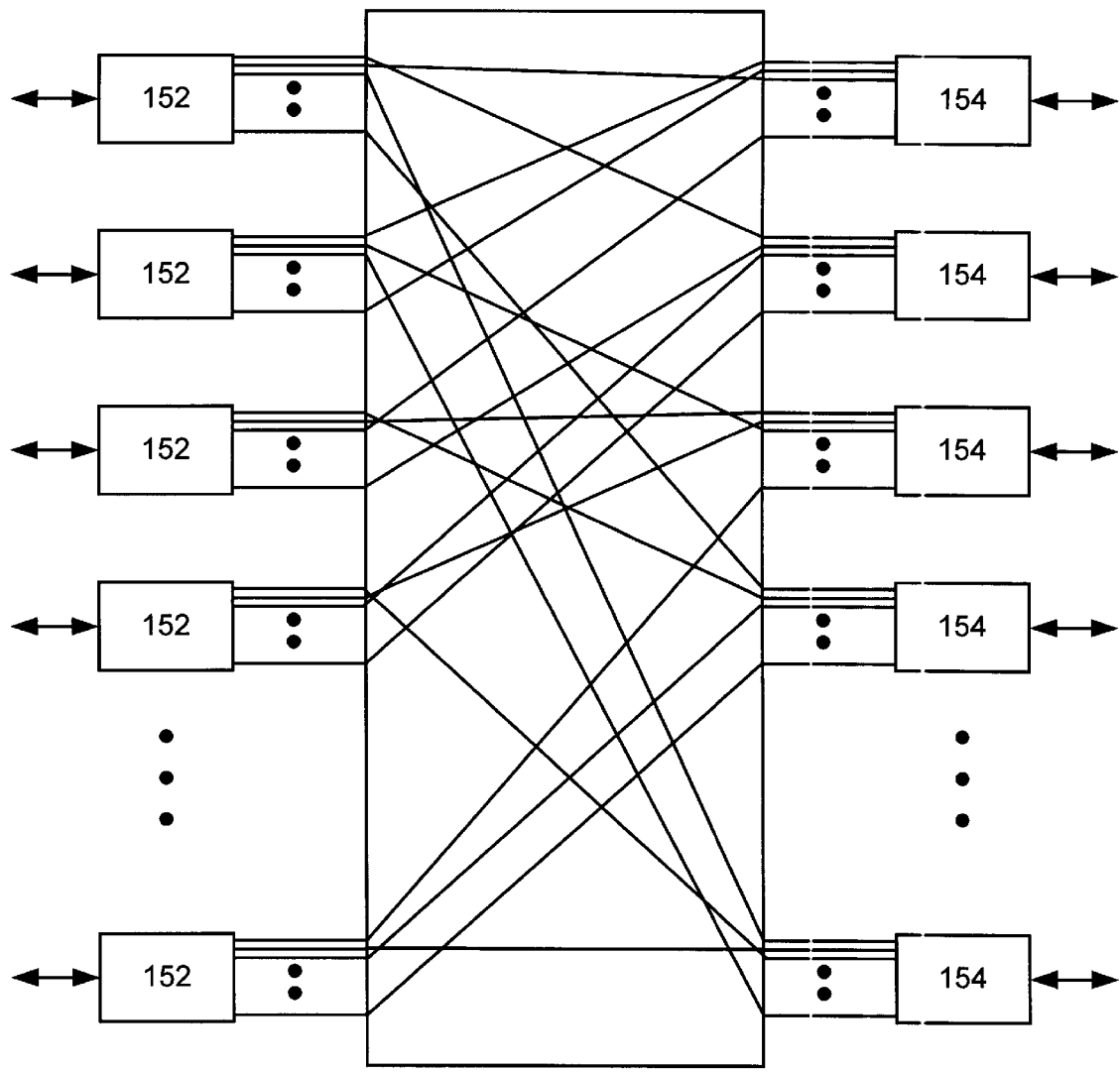
FIG. 1B is an illustration of an N×N cross-bar switch having a first plurality of N bi-directional ports selectably coupled a second plurality of N bidirectional ports.
Figure 2:
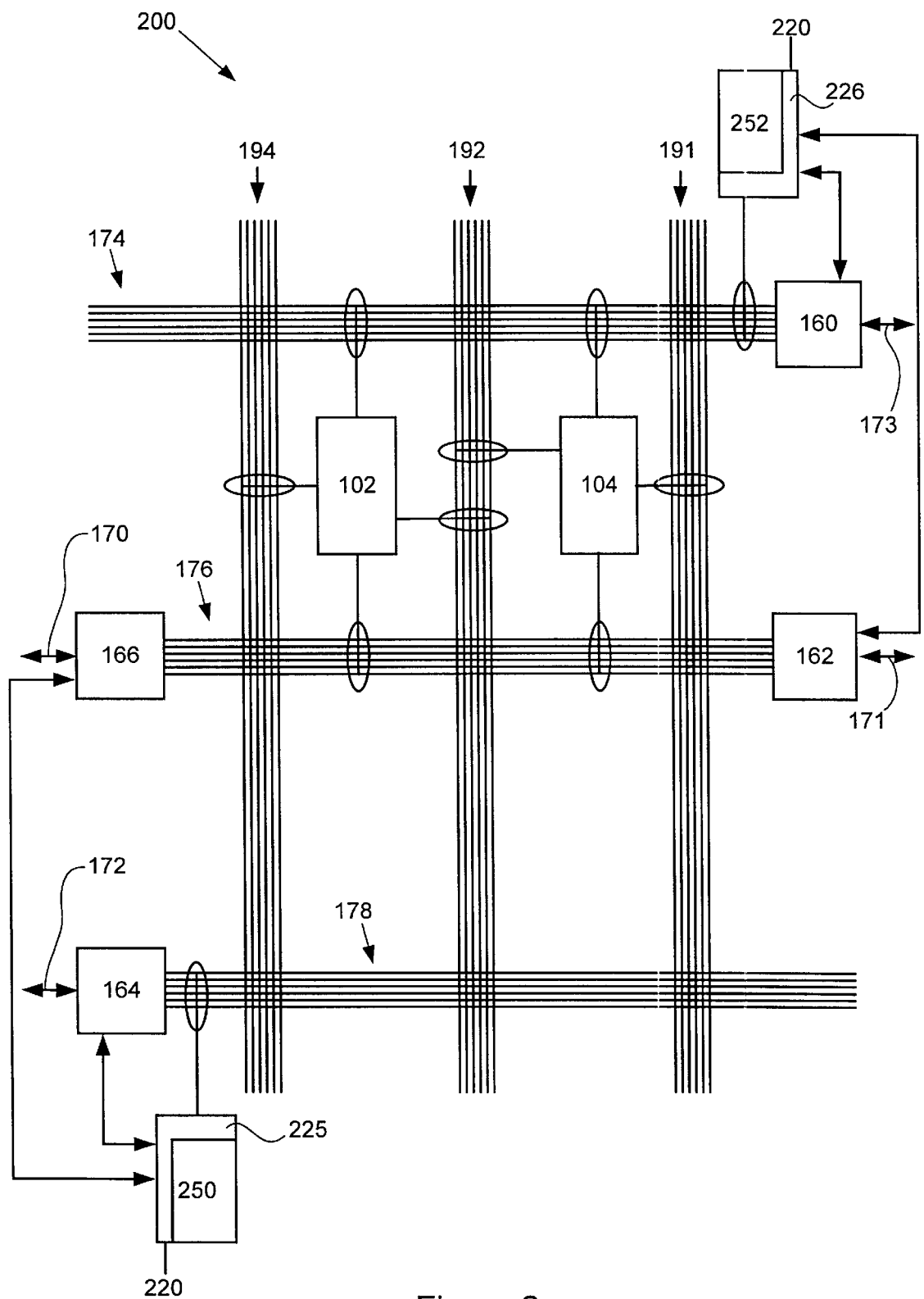
FIG. 2 is a functional block diagram of an embedded array type programmable logic device architecture incorporating an interface cross-bar switch block having an associated isolation circuit in accordance with a preferred embodiment of the invention.
Figure 3:
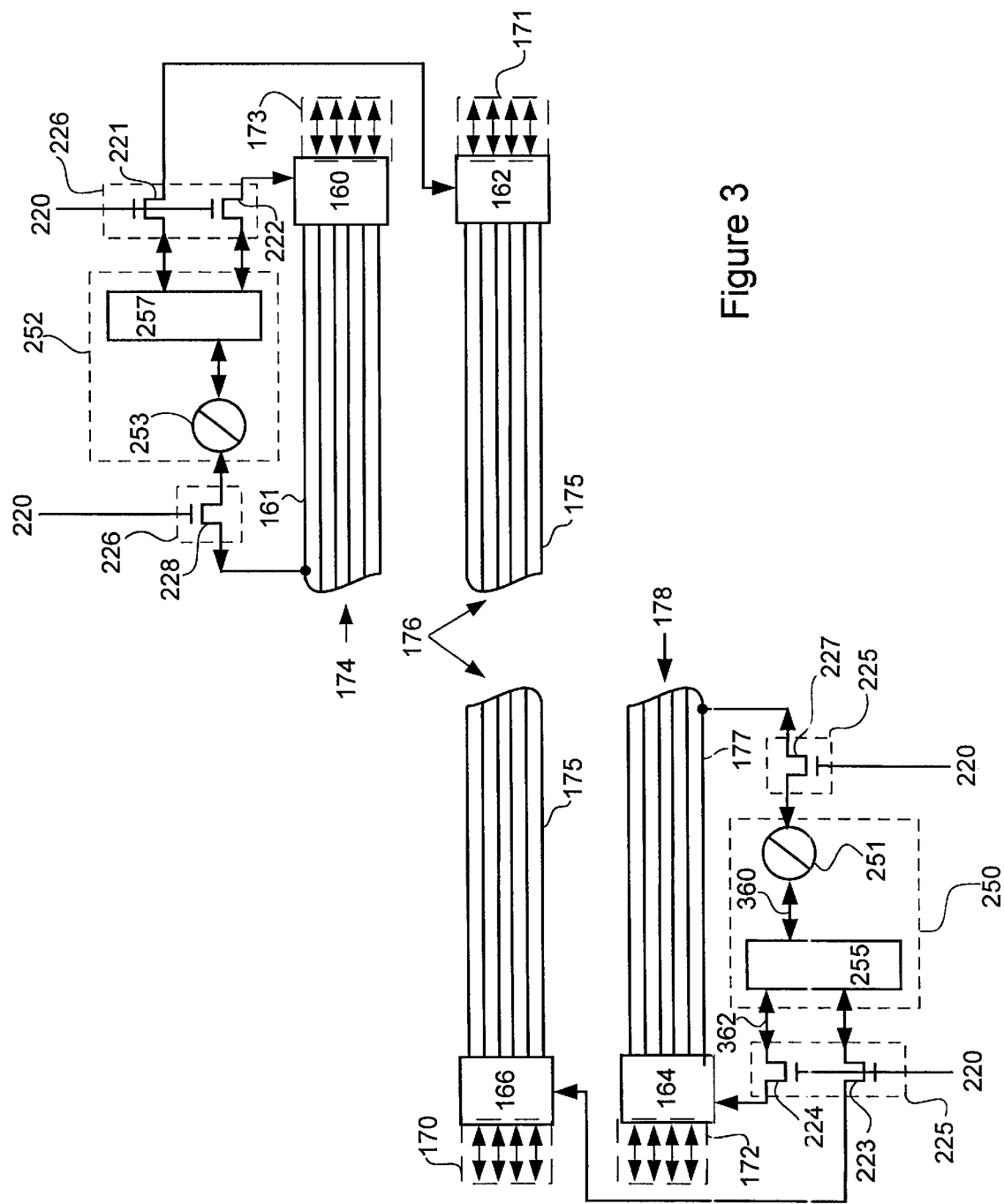
FIG. 3 is a schematic diagram of programmable logic device architecture incorporating an embedded interface cross-bar switch block having an associated isolation circuit as illustrated in FIG. 2.

Referring initially to FIG. 2 and FIG. 3, an embedded array type programmable logic device architecture incorporating an interface cross-bar switch in accordance with an embodiment of the invention will be described. FIG. 2 is a functional block diagram of an embedded array type complex programmable logic device CPLD 200. CPLD 200 includes an array of logic blocks 102 programmably coupled to horizontal conductors 174 and 176 as well as vertical conductors 192 and 194. CPLD 200 also includes an associated memory block 104 programmably coupled to a plurality of conductors which include horizontal conductor 174 and horizontal conductor 176 as well as vertical conductor 192 and vertical conductor 191. In this embodiment, each of the array of logic blocks 102 may include a plurality of logic cells (not shown).

For clarity of discussion, the cross-bar switch blocks described are for illustrative purpose only and it should be understood that any number of cross-bar switch blocks may be included within CPLD 200.

In the described embodiment, an interface cross-bar switch block 250 is selectably coupled to a bi-directional PLD ROW I/O 166 and a bi-directional PLD ROW I/O 164 by way of a first plurality of bi-directional ports 360. Interface cross-bar switch block 250 may also be selectably coupled to horizontal conductor 178 by way of a second plurality of bi-directional ports 362. In this manner, interface cross-bar switch block 250 may be selectably coupled to the array of logic blocks 102 and memory block 104. In one embodiment, each of the bi-directional PLD ROW I/Os may be coupled to a tri-stateable output driver which is enabled and disabled by a control signal. When enabled, the tri-state driver drives a data signal with a low impedance. Alternatively, when the tri-state driver is disabled the output driver assumes a high impedance state. In another embodiment, data buffers included within each of the PLD ROW I/Os may each be coupled to a clock signal generator such that the programmable logic device may be capable of operation in a synchronous as well as an asynchronous mode.

An associated isolation circuit 225 is disposed to electrically couple cross-bar switch block 250 to the array of logic blocks 102 and the memory block 104 in a user selectable first mode. Alternatively, in a user selectable second mode, isolation circuit 225 acts to electrically de-couple cross-bar switch block 250 from the array of logic blocks 102 and memory block 104. In a preferred embodiment, isolation circuit 225 is coupled to and activated by a mode control circuit switch 220.

In the described embodiment, an interface cross-bar switch block 252 includes a first plurality of bi-directional ports 364 selectably coupled to a bi-directional PLD ROW I/O 166 and a bi-directional PLD ROW I/O 164. Interface cross-bar switch block 252 may also include a second plurality of bi-directional ports 366 selectably coupled to horizontal conductor 174. In this manner, cross-bar switch block 252 may be selectably coupled to the array of logic blocks 102 and memory block 104 by way of bi-directional PLD ROW I/O 160 and bi-directional PLD ROW I/O 162 or horizontal conductor 174.

An isolation circuit 226 is disposed to electrically couple cross-bar switch block 252 to the array of logic blocks 102 and the memory block 104 in the first mode. In the second mode, isolation circuit 226 acts to electrically de-couple cross-bar switch block 252 from the array of logic blocks 102 and the memory block 104. Isolation circuit 226 is also coupled to and activated by mode control circuit switch 220.

Referring now to FIG. 3, PLD ROW I/O 164 may include a plurality of PLD I/Os 172 electrically coupled to a plurality of bi-directional row channels 177 included within horizontal conductor 178. Each of the plurality of row channels 177 may pass data independently of or in conjunction with other ones of the plurality of bi-directional row channels 177 included within the associated horizontal conductor 178. PLD ROW I/O 166 may include a plurality of PLD I/Os 170 electrically coupled to a plurality of bi-directional row channels 175 included within horizontal conductor 176. Similarly, PLD ROW I/O 162 may include a plurality of PLD I/Os 171 electrically coupled to the plurality of bi-directional row channels 175 included within horizontal conductor 176. PLD ROW I/O 160 may include a plurality of PLD I/Os 173 electrically coupled to a plurality of bi-directional row channels 161 included within horizontal conductor 174.

In the described embodiment, isolation circuit 225 includes a transistor 223 having a source coupled to PLD ROW I/O 166 and a drain coupled to the plurality of bi-directional ports 362. A transistor 224 has a source coupled to PLD ROW I/O 164 and a drain coupled to the plurality of bi-directional ports 362 of interface cross-bar switch block 250. Isolation circuit 225 also includes a transistor 227 having a source coupled to row channel 177 and a drain programmably coupled by way of programmable cross-bar switch block connector 251 to the plurality of bi-directional ports 360. The gates of transistor 223, transistor 224 and transistor 227 are each coupled to mode control circuit switch 220.

In the first mode, mode control circuit switch 220 supplies a first mode signal $V_{1mode}$ to the gates of transistors 223, 224, and 227 such that each of the transistors 223, 224, and 227 becomes substantially conducting. In this way, interface cross-bar switch block 250 is electrically coupled to the array of logic blocks 102 and the memory block 104. Alternatively, in the second mode, mode control switch circuit 220 supplies a second mode signal $V_{2mode}$ to the gates of transistors 223, 224, and 227 such that each transistor becomes substantially non-conducting. In this way, cross-bar switch block 250 is electrically de-coupled from the array of logic blocks 104 and the memory block 104.

In the described embodiment, isolation circuit 226 includes a transistor 222 having a source coupled to PLD ROW I/O 160 and a drain coupled to first interface cross-bar switch block 252 by way of the plurality of bi-directional ports 366. A transistor 221 has a source coupled to PLD ROW I/O 162 and a drain coupled to first interface cross-bar switch block 252. Isolation circuit 225 also includes a transistor 228 having a source coupled to row channel 161 and a drain programmably coupled to interface cross-bar switch block 252. The gates of transistor 223, transistor 224 and transistor 227 are each coupled to mode control circuit switch 220.

In the described embodiment, isolation circuit 226 acts in an analogous manner as isolation circuit 226 to electrically couple cross-bar switch block 252 from the array of logic cells in the first mode and de-couple in the second mode.

Interface cross-bar switch block 250 includes a dedicated associated programmable connector 251 suitably disposed to selectably couple row channel 177 to selected ones of the second plurality of bi-directional ports 360. Interface cross-bar switch block 250 also includes a cross-bar switch unit 255 suitable for selectably passing data from selected ones of the first plurality of bi-directional ports 362 to selected ones of the second plurality of bi-directional ports 360.

Similarly, interface cross-bar switch block 252 includes dedicated associated programmable connector 253 suitably disposed to selectably couple row channel 161 to selected ones of a plurality of bi-directional ports 364. Interface cross-bar switch block 252 also includes a cross-bar switch unit 257 suitable for selectably passing data from selected ones of the first plurality of bi-directional ports 364 to selected ones of the second plurality of bi-directional ports 366.

Figure 4:
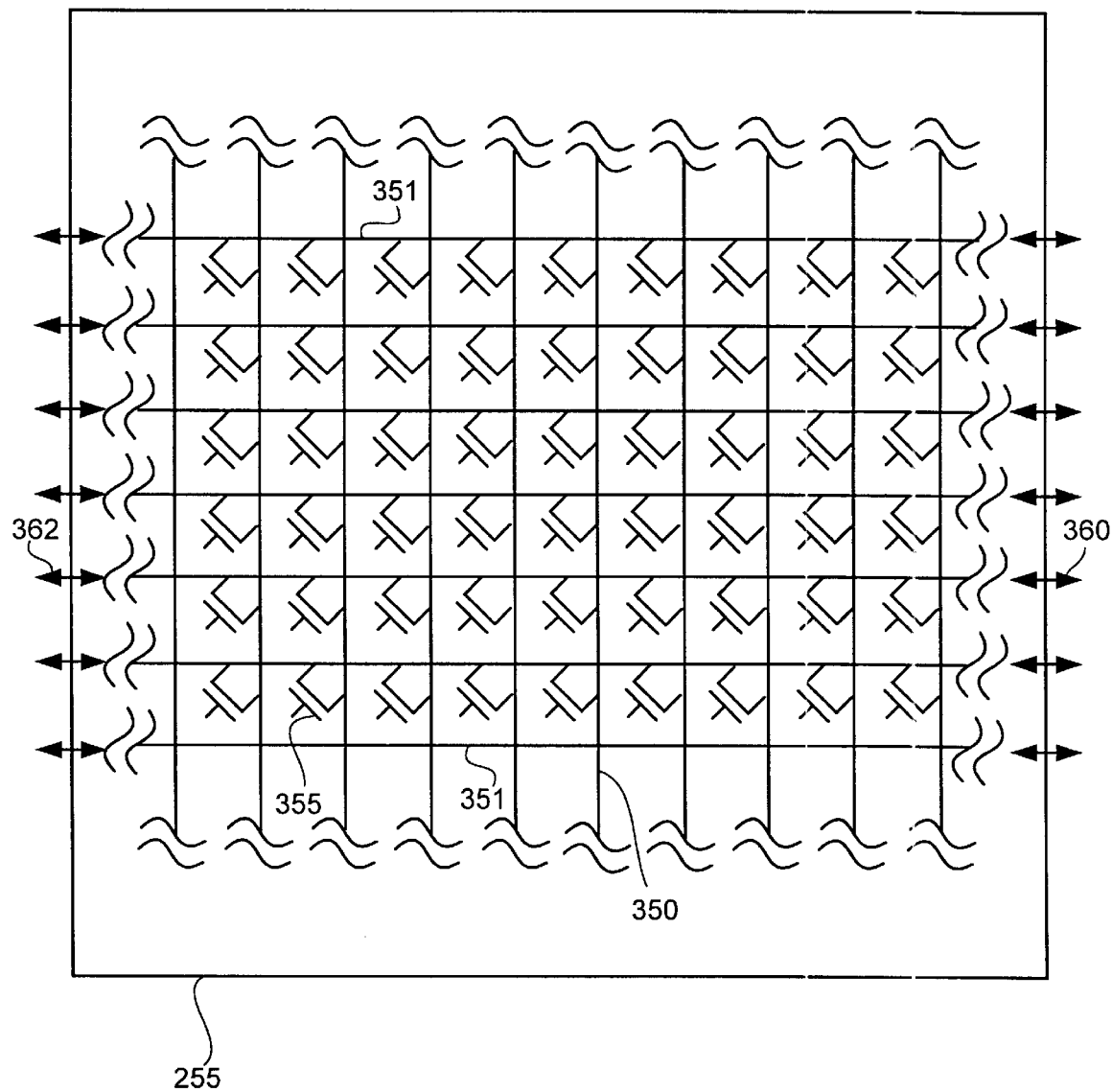
FIG. 4 is a schematic diagram of a cross-bar switch unit illustrating an array of cross-bar switch unit connectors programmably interconnecting a plurality of horizontal and vertical datalines so as to couple selected bi-directional ports in accordance with an embodiment of the invention.

In the described embodiment, the cross-bar switch unit 255 may take on any suitable configuration. By way of example, referring to FIG. 4, cross-bar switch unit 255 includes a plurality of vertical data lines 350 programmably connected by way of a plurality of programmable cross-bar unit connectors 355 to a plurality of horizontal data lines 351. Selected ones of the plurality of programmable cross-bar unit connectors 355 act to programmably couple selected vertical data line 350 and selected horizontal data line 351. In this manner, selected ones of the plurality of bi-directional ports 360 may be coupled to selected ones of the plurality of bi-directional ports 362.

Figure 5:
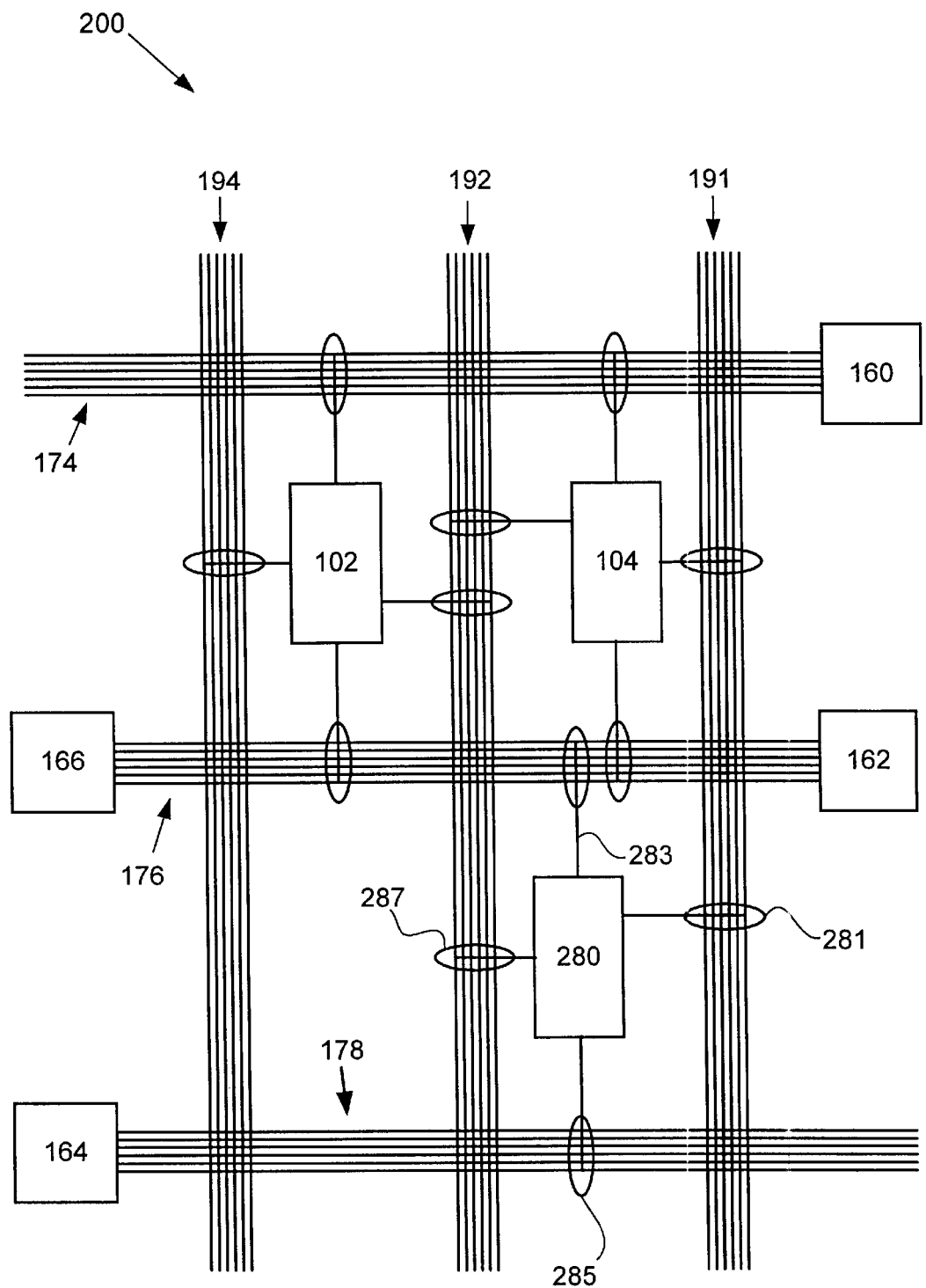
FIG. 5 is a functional block diagram of an embedded array logic type programmable logic device architecture incorporating an embedded kernal crossbar switch block in accordance with an embodiment of the invention.

An advantage of CPLD 200 is its ability to be repeatedly configured to perform different complex logic functions. This ability to configure desired complex logic functions is accomplished by selectively coupling various LABs (and the logic elements contained therein) included within CPLD 200. Implementation of complex logic function in CPLD 200, referred to as fitting, may require the interconnection of several LABs (and in some cases certain of the EABs) included within CPLD 200. In some cases, the LABs and/or EABs required to fit the logic or logic/memory function may be located in disparate portions of CPLD 200 core area further increasing the need of internal routing and programming resources. A kernal cross-bar switch block 280 as presented in FIG. 5 substantially increases the available internal routing and programming resources available to CPLD 200. In this manner, the capability of CPLD 200 to fit complex logic and logic/memory functions efficiently is substantially increased.

As shown, kernal cross-bar switch block 280 may be selectively connected to any of a plurality of bi-directional column channels 290 included within vertical conductor 191 by way of dedicated kernal cross-bar connectors 281. Kernal cross-bar switch block 280 may also be selectively connected to any of a plurality of bi-directional column channels 291 included within vertical conductor 192 by way of dedicated kernal cross-bar connectors 287. In the described embodiment, kernal cross-bar switch 280 may be programmably connected to horizontal conductor 178 by way of dedicated kernal cross-bar connectors 285 as well as horizontal conductor 176 by way of dedicated kernal cross-bar switch connectors 283. In this way, the number and variety of programmable internal routing paths suitable for fitting complex logic and logic/memory functions may be significantly increased.

Figure 6:
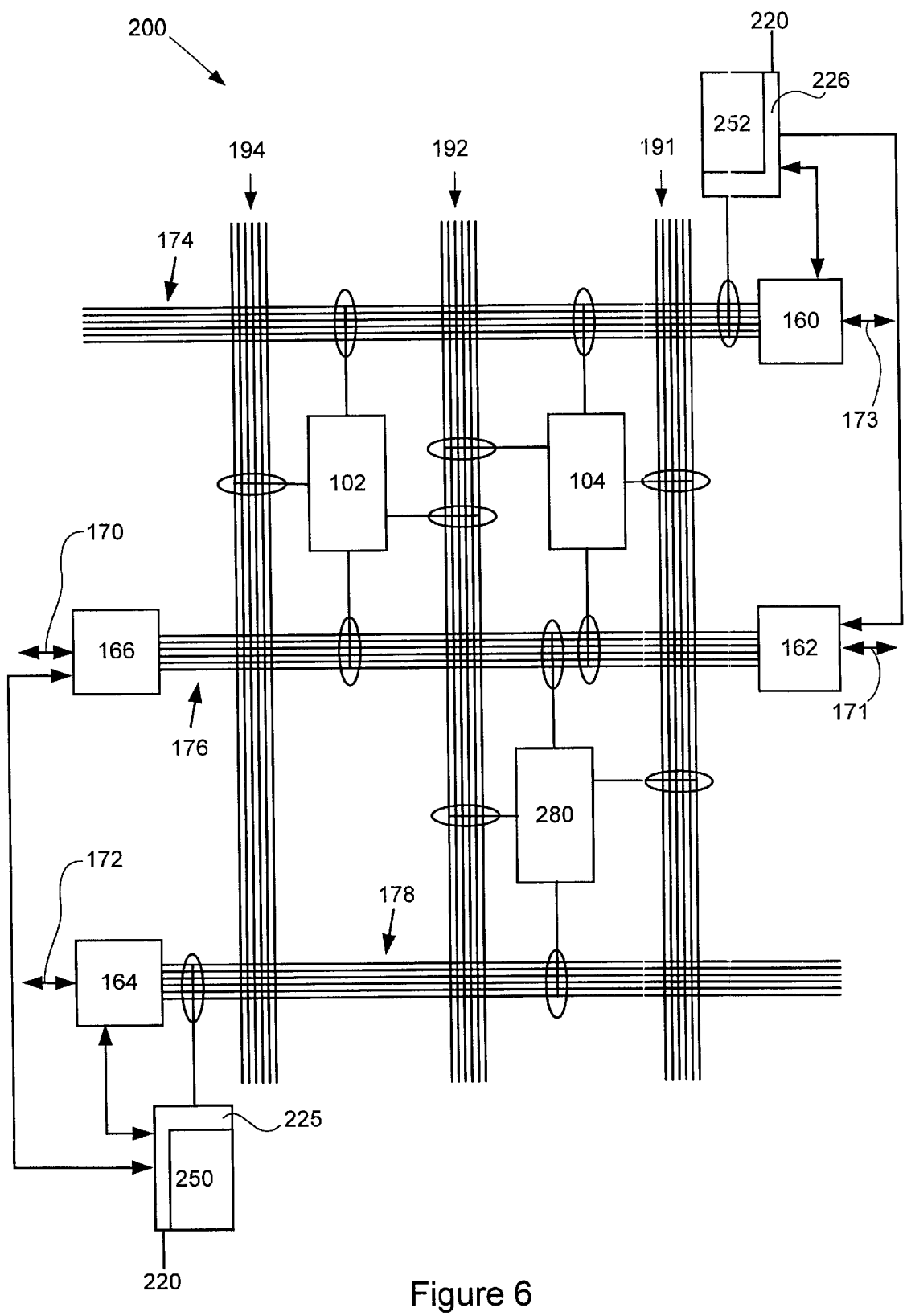
FIG. 6 is a functional block diagram of an embedded array type programmable logic architecture having a kernal cross-bar switch block and an interface cross-bar switch block in accordance with another embodiment of the invention.

FIG. 6 is a functional block diagram of programmable logic architecture incorporating both kernal cross-bar switch block 280 and interface cross-bar switch blocks 250 and 252 in accordance with an embodiment of the invention. In this embodiment, a user may be capable of selectively coupling any row channel with any column channel without substantially using the programming or routing resources allocated to the array of logic blocks 102 or the memory block 104. By way of example, a signal path from PLD ROW I/O 164 to PLD 162 may be formed simply by appropriately configuring kernal cross-bar switch block 280 to couple horizontal conductor 178 to horizontal conductor 176. In this manner, a great number of possible internal interconnects are available without substantially increasing the complexity of routing software or amount of programming resources required.

Figure 7:
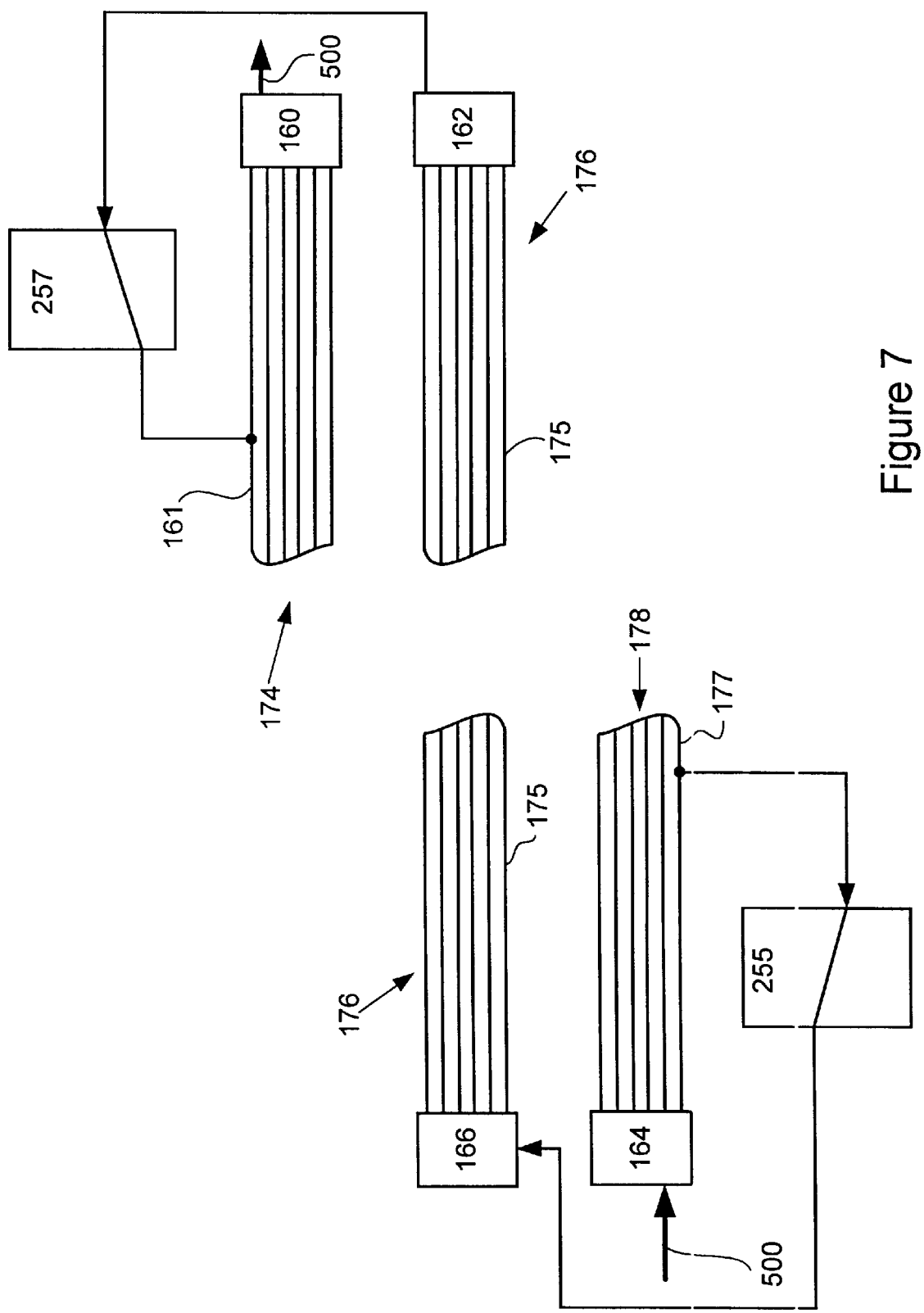
FIG. 7 is a schematic diagram of an embedded array type programmable logic architecture as shown in FIG. 2 configured to operate as a reconfigurable full cross-bar switch.

FIG. 7 is a schematic diagram of an embedded array type programmable logic architecture as shown in FIG. 2 configured to operate as a reconfigurable global cross-bar switch. A signal 500 is supplied to PLD ROW I/O. Mode control circuit switch 220 supplies first mode signal $V_{1mode}$ to isolation circuit 225 such that interface cross-bar switch 250 is electrically connected to PLD ROW I/O 164 and 166 by way of bi-directional nodes 362. In an analogous manner, mode control circuit switch 220 supplies first mode signal $V_{1mode}$ to isolation circuit 226 such that interface cross-bar switch block 252 is electrically connected to PLD ROW I/O 160 and 162.

Programmable interface cross-bar switch block connector 251 may be configured to form a conductive path from row channel 177 to interface cross-bar switch block 250 such that signal 500 may be an input to cross-bar switch block 250. Appropriately configured, cross-bar switch 250 then passes signal 500 to PLD ROW I/O 164 which is electrically coupled to PLD ROW I/O 162 by way of row channel 175. In an analogous manner to isolation circuit 225, isolation circuit 226 electrically connects PLD ROW I/O 162 and PLD ROW I/O 160 to an input of cross-bar switch block 252. Appropriately configured, interface cross-bar switch 252 then passes signal 500 to row channel 161 by way of programmable cross-bar connector 253. Row channel 161 then passes signal 500 to PLD ROW I/O 160.

Figure 8:
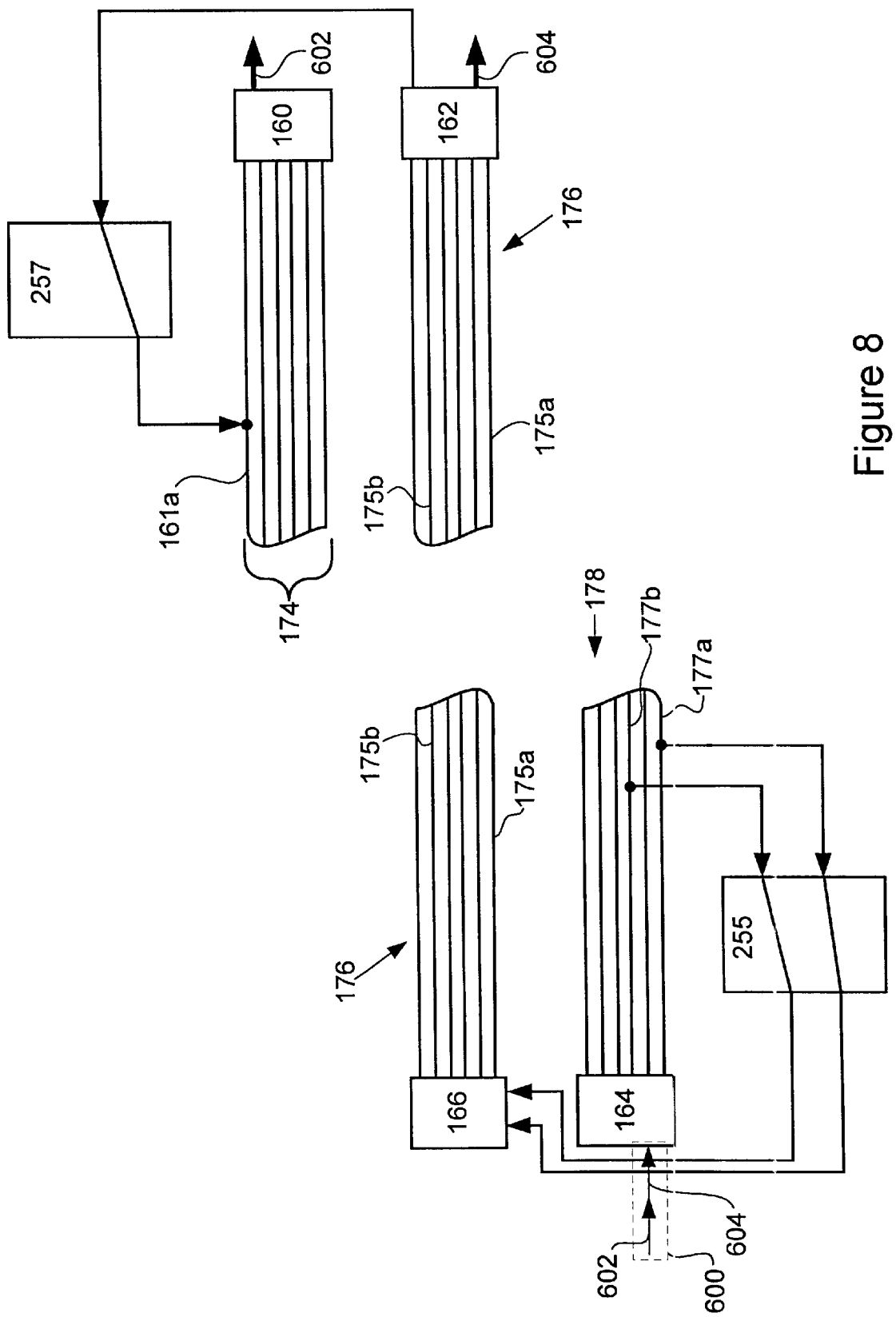
FIG. 8 is a schematic diagram of an embedded array type programmable logic architecture as shown in FIG. 2 configured to operate as a parallel to serial converter.

FIG. 8 is a schematic diagram of an embedded array type programmable logic architecture as shown in FIG. 2 configured to operate as a serial to parallel signal converter. A serial signal 600 includes data packets 602 and 604 supplied to PLD ROW I/O 164. Serial signal 600 may, for example, represent an input from an asynchronous transmission mode (ATM) traffic generator (such as a fax or modem) wherein data packets 602 and 604 may each represent different "calls" each being associated with a plurality of ATM data cells. In the described embodiment, a multiplexer (not shown) included within PLD ROW I/O 164 is capable of passing data packet 602 to row channel 177a and data packet 604 to row channel 177b. As discussed above, mode control circuit switch 220 acts to couple interface cross-bar switch 250 to PLD ROW I/O 164 and 166 and interface cross-bar switch block 252 to PLD ROW I/O 160 and 164.

Programmable interface cross-bar switch block connector 251 is configured to form a conductive path from row channels 177a and 177b to selected ones of the bi-directional ports 362 of interface cross-bar switch block 250. Appropriately configured, cross-bar switch 250 passes each data packet 602 and 604 to row channels 175a and 175b, respectively, included within PLD ROW I/O 164. In the described embodiment, each of the row channels 175a and 175b is electrically coupled to PLD ROW I/O 162 such that data packet 604 may form an input to and be stored within a synchronous data register (not shown) included within PLD ROW I/O 162. Substantially simultaneously, interface cross-bar switch 252, appropriately configured, then passes data stream 602 to row channel 161 by way of programmable cross-bar connector 253. Row channel 161 then passes data stream 602 to PLD ROW I/O 160 thereby converting serial data signal 600 into parallel data signals 602 and 604.

Although the foregoing invention has been described in some detail for purposes of clarity of understanding, it will be apparent that certain changes and modifications may be practiced within the scope of the appended claims. It should be noted that there are may alternative ways of implementing the present invention. By way of example, an interface cross-bar switch or a kernal cross-bar switch may be used, separately or together, to couple any ones of a plurality of horizontal PLD I/Os to any selected ones of a plurality of vertical I/Os. In yet another embodiment, the interface cross-bar switch block may be used in conjunction with the kernal cross-bar switch block to implement (or fit) complex logic or logic/memory functions otherwise impracticable with more conventional CPLD architecture. It is therefore intended that the following appended claims be interpreted as including all such alterations, permutations, and equivalents as fall within the spirit and scope of the present invention.

We claim:

1. A programmable logic device comprising:
   a plurality of logic cells interconnected by way of associated programmable logic cell connectors to form an array of logic cells, the array of logic cells being suitable for use in implementing desired logic functions;
   a dedicated programmable cross-bar switch block suitable for passing data between a first plurality of bi-directional ports and a second plurality of bi-directional ports; and
   an isolation circuit suitable for selectively coupling the cross-bar switch block to the array of logic cells in a first mode and decoupling the cross-bar switch block from the array of logic cells in a second mode.

2. A programmable logic device as recited in claim 1 further comprising a mode control switch for switching the isolation circuit between the first and second modes such that the isolation circuit electrically connects the cross-bar switch block to the array of logic cells in the first mode and electrically disconnects the cross-bar switch block from the array of logic cells in the second mode.

3. A programmable logic device as recited in claim 2 wherein the isolation circuit includes:
   a first transistor arranged to selectably couple the first plurality of bi-directional ports of the cross-bar switch block to the array of logic cells; and
   a second transistor arranged to selectably couple the second plurality of bi-directional ports of the cross-bar switch block to the array of logic cells.

4. A programmable logic device as recited in claim 3 wherein the mode control circuit is coupled to the first transistor and the second transistor such that:

in the first mode the first and secnd transistors are substantially conducting thereby coupling the first and second plurality of bi-directional ports to the array of logic cells, and in the second mode the first and second transistors are substantially non-conducting thereby de-coupling the first and second plurality of bi-directional ports from the array of logic cells.

5. A programmable logic device as recited in claim 1 wherein the dedicated cross-bar switch block further includes:

a cross-bar switch unit suitably arranged to pass data from selected ones of the first plurality of bi-directional ports to selected ones of the second plurality of bi-directional ports; and a plurality of associated dedicated cross-bar switch block programmable connectors suitable for coupling selected ones of the second plurality of bi-directional ports to the array of logic cells.

6. A programmable logic device as recited in claim 5 wherein the cross-bar switch unit further comprises:

a plurality of horizontal data lines, each data line being connected to an associated one of the first plurality of bi-directional ports and being connected to an associated one of the second plurality of bi-directional ports;

a plurality of vertical data lines; and an array of selectable programmable cross-bar unit connectors suitably arranged to couple selected ones of the plurality of vertical data lines to selected ones of the plurality of horizontal data lines such that selected ones of the plurality of first bi-directional ports are electrically connected to selected ones of the second plurality of bi-directional ports.

7. A programmable logic device as recited in claim 6 further comprising a memory block programmably coupled to the array of logic cells by way of associated programmable memory block connectors, the memory block being suitable for implementing desired memory functions.

8. A programmable logic device comprising:

a plurality of logic blocks interconnected by way of associated programmable block connectors to form an array of logic blocks, the array of logic blocks each including an associated array of logic cells and being suitable for use in implementing desired logic functions;

a memory block programmably coupled to the array of logic blocks by way of the programmable block connectors, the memory block including an array of memory cells, the memory block being suitable for implementing desired memory functions;

a dedicated programmable cross-bar switch block suitable for passing data between a first plurality of bi-directional ports and a second plurality of bi-directional ports; and an isolation circuit suitable for selectively coupling the cross-bar switch block to the array of logic blocks and the memory block in a first mode and decoupling the cross-bar switch block from the array of logic blocks in a second mode.

9. A programmable logic device as recited in claim 8 further comprising a mode control switch for switching the isolation circuit between the first and second modes such that the isolation circuit electrically connects the cross-bar switch block to the array of logic blocks in the first mode and electrically disconnects the cross-bar switch block from the array of logic blocks in the second mode.

10. A programmable logic device as recited in claim 9 wherein the isolation circuit includes:

a first transistor arranged to selectably couple the first plurality of bi-directional ports of the cross-bar switch block to the array of logic blocks; and a second transistor arranged to selectably couple the second plurality of bi-directional ports of the cross-bar switch block to the array of logic blocks.

11. A programmable logic device as recited in claim 10 wherein the mode control circuit is coupled to the first transistor and the second transistor such that, in the first mode the first and second transistors are substantially conducting thereby coupling the first and second plurality of bi-directional ports to the array of logic blocks, and in the second mode the first and second transistors are substantially non-conducting thereby de-coupling the first and second plurality of bi-directional ports from the array of logic blocks.

12. A programmable logic device as recited in claim 8 wherein the dedicated cross-bar switch block further includes:

a cross-bar switch unit suitably arranged to pass data from selected ones of the first plurality of bi-directional ports to selected ones of the second plurality of bi-directional ports; and a plurality of associated dedicated cross-bar switch block programmable connectors suitable for coupling selected ones of the second plurality of bi-directional ports to the array of logic blocks.

13. A method of implementing a desired function using a programmable logic device having a dedicated cross-bar switch block that may be selectively coupled to an array of logic cells capable of performing complex logic functions, the method comprising:

supplying a first mode control signal to an isolation circuit associated with the cross-bar switch block, the first mode signal causing the isolation circuit to electrically couple the cross-bar switch block to a plurality of conductors that interconnect the array of logic cells; and configuring the cross-bar switch block such that selected ones of a first plurality of bi-directional ports are selectively coupled to selected ones of a second plurality of bi-directional ports associated with the cross-bar switch so as to provide a desired cross-bar switch signal routing.

14. A method as recited in claim 13 further comprising reconfiguring the cross-bar switch block such that a second cross-bar switch signal routing is provided.

15. A method as recited in claim 13 further comprising supplying a second mode signal to de-couple the cross-bar switch block from the plurality of conductors.

16. A programmable logic device comprising:

a plurality of logic blocks interconnected by way of associated programmable block connectors to form an array of logic blocks, the array of logic blocks each including an associated array of internal logic cells that are interconnected by way of associated programmable cell connectors, each logic block being suitable for use in implementing desired logic functions; and a dedicated programmable cross-bar switch block that is separate and distinct from the logic blocks and does not include programmable logic cells suitable for implementing desired logic functions, the dedicated programmable cross-bar switch being suitable for passing data between associated programmable block connectors.

17. A programmable logic device as recited in claim 16 further comprising a memory block programmably coupled to the array of logic blocks by way of the programmable block connectors, the memory block including an array of memory cells, the memory block being suitable for implementing desired memory functions.

18. A programmable logic device as recited in claim 16 wherein:

the programmable block connectors include a multiplicity of vertical conductors and a multiplicity of horizontal conductors; and the cross-bar switch is arranged to programmably connect selected ones of the vertical conductors to selected ones of the horizontal conductors.

19. A programmable logic device as recited in claim 16 wherein:

the programmable block connectors include a multiplicity of vertical conductors and a multiplicity of horizontal conductors; and the cross-bar switch is arranged to programmably connect a first selected group of the horizontal conductors to a second selected group of the horizontal conductors.

20. A programmable logic device as recited in claim 16 wherein:

the programmable block connectors include a multiplicity of vertical conductors and a multiplicity of horizontal conductors; and the cross-bar switch is arranged to programmably connect a first selected group of the vertical conductors to a second selected group of the vertical conductors.

21. A programmable logic device as recited in claim 20 wherein the cross-bar switch is further arranged to programmably connect a third group of the horizontal conductors to selected ones of the vertical conductors and to selected ones of the horizontal conductors.

* * * * *